United States Patent
Lee et al.

(10) Patent No.: US 7,821,104 B2
(45) Date of Patent: Oct. 26, 2010

(54) PACKAGE DEVICE HAVING CRACK ARREST FEATURE AND METHOD OF FORMING

(75) Inventors: Chu-Chung Lee, Round Rock, TX (US); Min Ding, Austin, TX (US); Kevin J. Hess, Round Rock, TX (US); Peng Su, San Jose, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 111 days.

(21) Appl. No.: 12/201,623

(22) Filed: Aug. 29, 2008

(65) Prior Publication Data

US 2010/0052106 A1    Mar. 4, 2010

(51) Int. Cl.
H01L 23/544 (2006.01)
H01L 23/58 (2006.01)
H01L 21/768 (2006.01)
H01L 21/78 (2006.01)

(52) U.S. Cl. ............... 257/620; 257/629; 257/E21.596; 257/E21.599

(58) Field of Classification Search ................. 257/620, 257/629, E21.596, E21.599
See application file for complete search history.

(56) References Cited

U.S. PATENT DOCUMENTS

| | | | |
|---|---|---|---|
| 4,832,996 A | 5/1989 | Lesk et al. | |
| 4,928,162 A | 5/1990 | Lesk et al. | |
| 5,763,936 A | 6/1998 | Yamaha et al. | |
| 5,789,302 A | 8/1998 | Mitwalsky et al. | |
| 5,885,857 A * | 3/1999 | Yamaha et al. | 438/129 |
| 6,028,347 A * | 2/2000 | Sauber et al. | 257/622 |
| 6,261,945 B1 | 7/2001 | Nye, III et al. | |
| 6,383,893 B1 | 5/2002 | Begle et al. | |
| 6,507,086 B1 * | 1/2003 | Minn et al. | 257/529 |
| 6,570,243 B1 * | 5/2003 | Hagihara | 257/620 |
| 6,650,010 B2 * | 11/2003 | Davis et al. | 257/700 |
| 6,753,608 B2 * | 6/2004 | Tomita | 257/758 |
| 6,951,801 B2 | 10/2005 | Pozder et al. | |
| 7,265,436 B2 * | 9/2007 | Huang et al. | 257/620 |
| 7,335,577 B2 * | 2/2008 | Daubenspeck et al. | 438/462 |
| 2005/0242425 A1 | 11/2005 | Leal et al. | |
| 2006/0192301 A1 | 8/2006 | Leal et al. | |

* cited by examiner

Primary Examiner—Luan C Thai
(74) Attorney, Agent, or Firm—Kim-Marie Vo; James L. Clingan, Jr.

(57) ABSTRACT

A package device has a package substrate, a semiconductor die on the package substrate, and a molding compound on the package substrate and over the semiconductor die. The semiconductor die has a last passivation layer, an active circuit region in an internal portion of the die, an edge seal region along a periphery of the die, and a structure over the edge seal region extending above the last passivation layer, covered by the molding compound, and comprising a polymer material. The structure may extend at least five microns above the last passivation layer. The structure stops cracks in the molding compound from reaching the active circuit region. The cracks, if not stopped, can reach wire bonds in the active region and cause them to fail.

19 Claims, 2 Drawing Sheets

PACKAGE DEVICE HAVING CRACK ARREST FEATURE AND METHOD OF FORMING

BACKGROUND

1. Field

This disclosure relates generally to semiconductor packages, and more specifically, to crack arrest features in semiconductor packages.

2. Related Art

Consumers demand smaller semiconductor devices with increased functionality. To achieve these desires, semiconductor devices can be decreased in size while adding additional circuitry. In wirebond packages, the additional circuitry requires additional wires to couple the semiconductor die to external terminals. Because the number of wires is increased and the size of the die is decreased, wires are likely to be closer together.

As the spacing between wires decreases, the filler in the molding compound may be blocked resulting in the mold compound having resin-rich areas. The resin-rich areas have a higher coefficient of thermal expansion (CTE) and a decreased strength than areas with more filler. When exposed to changes in temperatures, a crack is created in the resin-rich area. The crack will propagate either in the molding compound close to the die top surface or at the interface between the molding compound and the die top surface. The crack can separate the ball bond from the semiconductor die. Hence, the increased number of wires can create cracks that damage the semiconductor device. A need exists to prevent such cracks from damaging the semiconductor device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
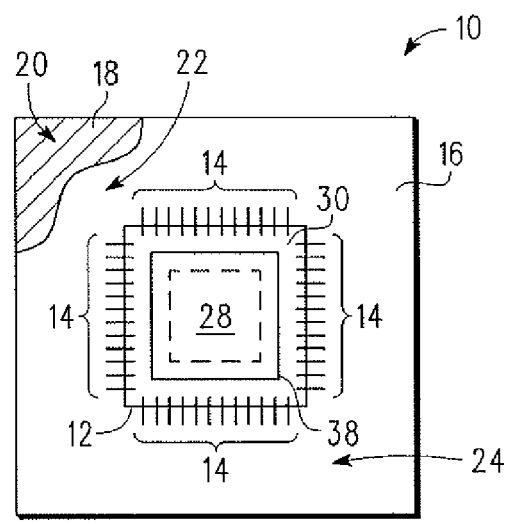
FIG. 1 illustrates a top-down view of a semiconductor die assembly while flowing the molding compound to form a semiconductor package in accordance with one embodiment.

In one embodiment, a semiconductor package includes one or more molding compound crack stops 38 that are means for preventing cracks that occur in the molding compound 18 from extending into the active circuit region 28 of a semiconductor die 12. The molding cracks stops 38 are located in an edge seal region 30.

FIG. 1 illustrates a top-down view of a semiconductor die assembly 10 while forming a molding compound 18 in accordance with one embodiment. The semiconductor die assembly 10 includes a semiconductor die 12 that is coupled to a package substrate 16 through wires 14. In one embodiment, the number of wires per length of die edge (linear wire density) is approximately 20 wires per millimeter. In one embodiment, there are 800 wires 14 coupled to the semiconductor die 12. The semiconductor die 12 can be any semiconductor die, such as a logic device, memory device, the like, or combinations of the above. As will be better understood after further discussion, the semiconductor die 12 includes an active circuit region 28 surrounded by an edge seal region 30. In the embodiment illustrated, the edge seal region 30 includes a molding compound crack stop 38 that also surrounds the active circuit region 28. The edge seal region 30 is located along a periphery of the semiconductor die 12. The active region 28 is located in an internal portion of the semiconductor die 12. The package substrate 16 can be any suitable package substrate, such as bismaleimide triazine (BT) resin, FR4 laminate, the like, and combinations of the above. In one embodiment, the wires 14 are gold wires.

As illustrated, a molding compound 18 flows 20 from one corner of a semiconductor die assembly 10 to a diagonally opposite corner. An area near the corner where the molding compound 18 begins to flow has a nominal filler density region 22. The nominal filler density region 22 has a filler density that is typical of the mold compound being used. For example, the nominal filler density region 22 may have silica particles that vary in size as per a normal distribution with an average diameter of approximately 30 microns. As the molding compound 18 flows 20 from one corner of the semiconductor die assembly 10 to an opposite corner, the wires 14 may block the filler in the molding compound 18 and create a low filler density region 24. The low filler density region 24 has a filler density and concentration of filler less than that of the nominal filler density region 22. In one embodiment, the low filler density region 24 is a resin-rich region. The filler in the molding compound 18 may be any suitable material, such as alumina, silica, boron nitride, silicon dioxide, the like, or combinations of the above.

Figure 2:
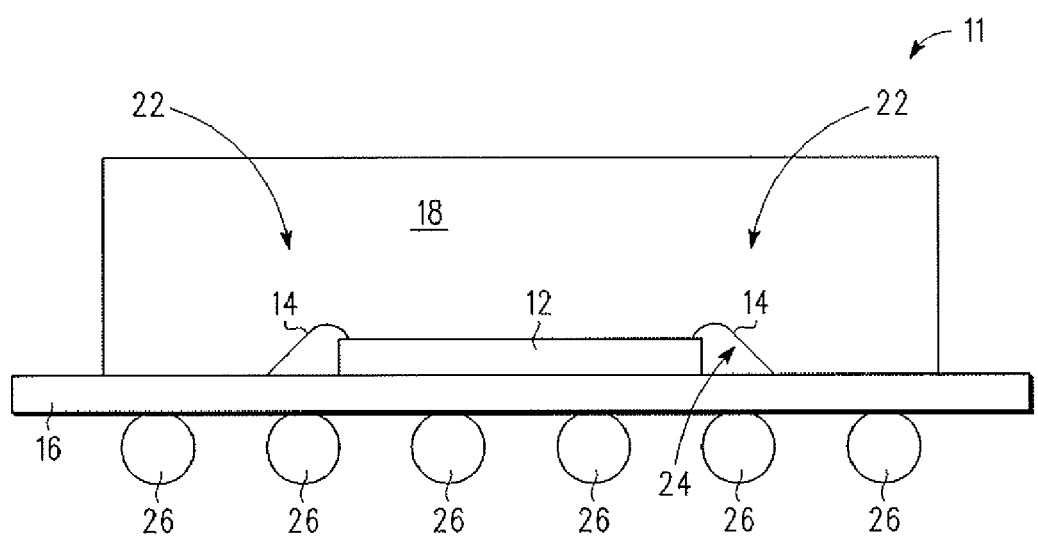
FIG. 2 illustrates a cross-section of the semiconductor package formed in FIG. 1 in accordance with one embodiment.

FIG. 2 illustrates a cross-section of a semiconductor package 11 which is the semiconductor die assembly 10 of FIG. 1 after the molding compound 18 is formed over the package substrate 16. The semiconductor package 11 includes the semiconductor die 12 formed over the package substrate 16 and coupled to the package substrate 16 through wires 14. The semiconductor die 12 is also coupled to solder balls 26. Due to the presence of the solder balls 26, the semiconductor package 11 in the embodiment illustrated is a ball-grid array (BGA) package. In the embodiment illustrated, the molding compound 18 includes the low filler density region 24 under the wire 14 and adjacent the semiconductor die 12 in the corner of the semiconductor package 11 that is diagonally opposite the corner where the molding compound 18 begins to flow. In the embodiment illustrated, nominal filler density regions 22 exists over the low filler density region 24 and over the corner linearly opposite the corner where the low filler density region 24 occurs. The area under the wire 14 adjacent an edge opposite the edge where the low filler density region 24 occurs may be a nominal filler density region 22, a low filler density region 24, or a region that has a filler density between that of the nominal filler density region 22 and the low filler density region 24. Hence, the filler density may vary both in the x and y directions (the directions parallel to that of the semiconductor die 12) and the z-direction (the direction perpendicular to the semiconductor die 12).

Figure 3:
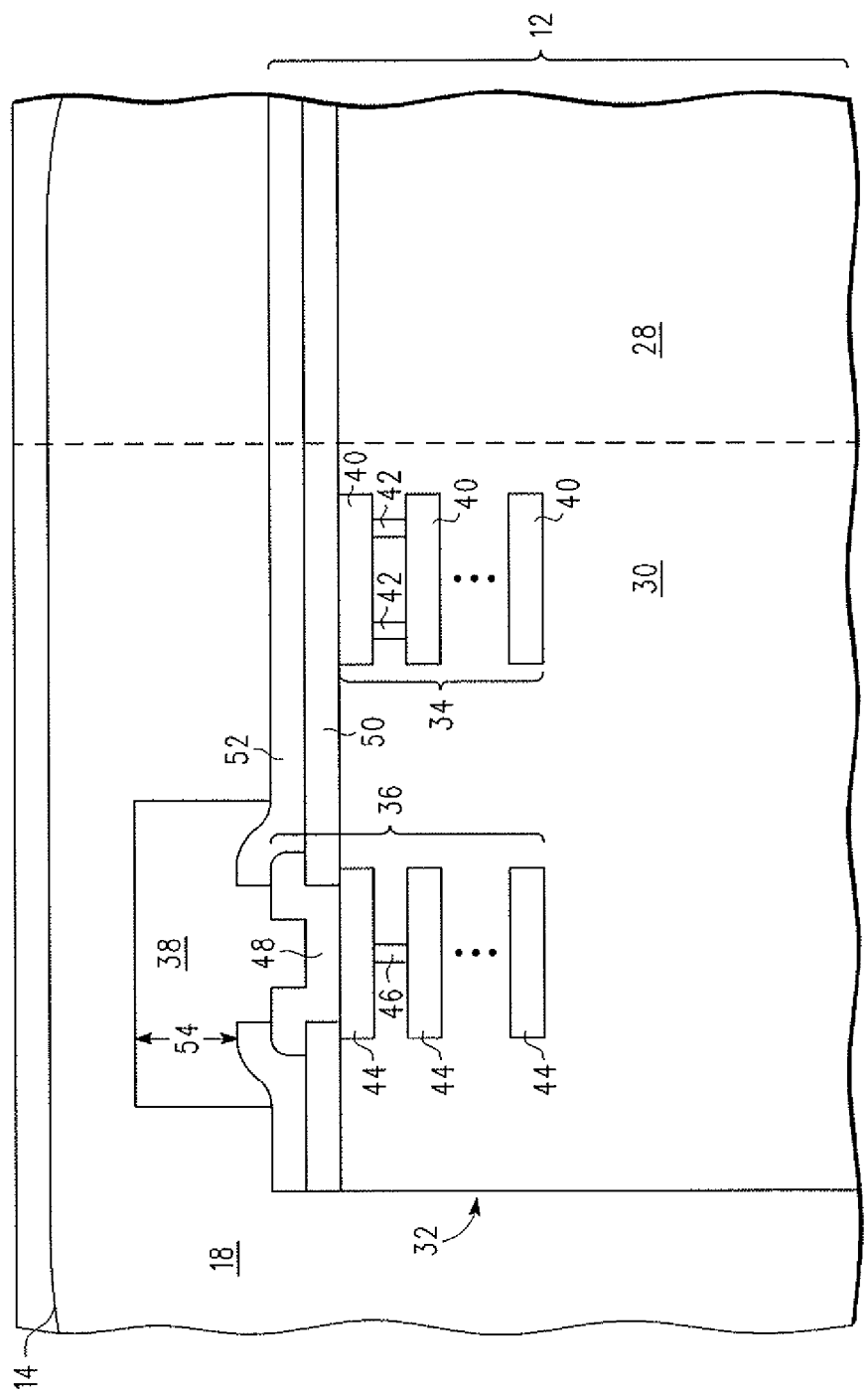
FIG. 3 illustrates a cross-section of a portion of the packaged semiconductor die and a portion of the molding compound of FIG. 2 in accordance with one embodiment.

FIG. 3 illustrates a cross-section of a portion of the semiconductor die 12 and a portion of the molding compound 18. The semiconductor die 12 includes an active circuit region 28 and an edge seal region 30 located between the active circuit region 28 and the edge 32 of the semiconductor die 12. Thus, the edge seal region 30 is adjacent to the edge 32 and is closer to the edge 32 than the active circuit region 28. The active circuit region 28 includes the active circuitry that is used for the functionality of the device. For example, the active circuit region 28 may include circuitry used for logic or memory functions. In the embodiment illustrated, the edge seal region 30 includes a moisture barrier 34, a dicing crack stop 36 and a molding compound crack stop 38.

The moisture barrier 34 may be formed to prevent moisture from penetrating into the active circuit region 28. The moisture barrier 34 may include metal layers 40 formed over each other and electrically coupled to each other through vias 42. In one embodiment, the metal layers 40 include copper and the vias 42 includes copper. In another embodiment, the metal layers 40 include aluminum and the vias 42 include tungsten. Any number of metal layers 40, such as one or more metal layers 40 may be present. In addition, any number of vias 42 (e.g., one or more vias 42) may be formed between pairs of metal layers 40. The moisture barrier 34 is formed within the semiconductor die in the edge seal region 30. In one embodiment, the moisture barrier 34 is not formed.

The dicing crack stop 36 may be formed to prevent cracks created when the semiconductor die 12 is singulated (e.g., by a saw or laser) from penetrating into the active circuit region 28. In the embodiment illustrated, the dicing crack stop 36 includes metal layers 44 over each other and electrically coupled to each other through a via 46. In one embodiment, the metal layers 44 include copper and the via 46 includes copper. In another embodiment, the metal layers 44 include aluminum and the via 46 includes tungsten. Any number of metal layers 44, such as one or more metal layers 44 may be present. In addition, any number of vias 46 (e.g., one or more vias 46) may be formed between pairs of metal layers 44. The metal layers 44 and the via 46 are formed within the semiconductor die in the edge seal region 30. The dicing crack stop 36 may also include a metal end cap 48 formed over the metal layers 44 to prevent the metal layer 44 from oxidizing, if the metal layer 44 is a material that would oxidize, such as copper. The metal end cap 48 may be formed over a first passivation layer 50. The first passivation layer 50 may be formed to protect structures, within the semiconductor die 12, such as the moisture barrier 34. A second passivation layer 52 may be formed over the metal end cap 48 if portions of the metal end cap 48 (not shown) are used for routing. Any number of passivation layers 50 and 52 may be present. Regardless, a last passivation layer will be present. The last passivation layer is the passivation layer that does not have another passivation layer formed over it and has a portion in contact with the molding compound 18. Hence, in the embodiment illustrated in FIG. 3, the last passivation layer is the second passivation layer 52 and the first passivation layer is an underlying passivation layer. If the second passivation layer 52 was not present in the embodiment illustrated in FIG. 3, then the first passivation layer 50 would be the last passivation layer.

In the embodiment illustrated in FIG. 3, the molding compound crack stop 38 is formed over the dicing crack stop 36. The molding compound crack stop 38 has a height 54 that extends above the last passivation layer 52. In one embodiment, the height 54 is greater than approximately 5 microns. In another embodiment, the height 54 is approximately 10 microns and yet in another embodiment, the height is approximately 18 microns. In one embodiment where the height is approximately 18 microns, the molding compound crack stop 38 includes approximately 8 microns of copper under approximately 10 microns of a polymer. In one embodiment, the molding compound crack stop 38 includes a polymer. In another embodiment, the molding compound crack stop 38 includes multiple materials, such as a polymer and a metal. The molding compound crack stop 38 is formed over the last passivation layer 52 and is in contact with the molding compound 18 and the last passivation layer 52. (The molding compound crack stop 38 may also be in contact with other layers or features. For example, as illustrated, the molding compound crack stop 38 may be in contact with the metal end cap 48.) The material(s) chosen for the molding compound crack stop 38 preferably have good adhesion to the molding compound 18 and the last passivation layer 52. Since metals do not have good adhesion to the molding compound 18, at least a portion of the molding compound crack stop 38, which is in contact with the molding compound, includes a polymer. Hence, in one embodiment the polymer material used for at least a portion of the molding compound crack stop 38 has an interface with the molding compound. In this embodiment, the interface includes direct contact between the molding compound and the polymer material. The polymer may be polyimide, benzocyclobutene (BCB), the like or combinations of the above. The metal can be any suitable metal, such as copper, aluminum, the like, or combinations of the above. In one embodiment the metal is copper formed by electroplating.

With the presence of the molding compound crack stop 38 when a crack is created near the edge 32 of the semiconductor die, the molding compound crack stop 38 will direct the crack to propagate in a substantially vertical direction and prevent the crack from entering the active circuit region 28. If the crack does not enter the active circuit region 28, then the wire 14 will not be disconnected from the semiconductor die 12 and functionality of the semiconductor die 12 will not be lost.

Although not illustrated, a glue layer may be present between the metal end cap 48 and the molding compound crack stop 38 to improve adhesion between the metal end cap 48 and the molding compound crack stop 38. In one embodiment, the glue layer includes titanium tungsten. In another embodiment, the glue layer includes tantalum.

By now it should be appreciated that there has been provided methods and structures for preventing molding compound crack from propagating into the active circuit region 28 along the interface between the surface of the semiconductor die 12 and the molding compound 18.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the molding compound crack stop 38 can be anywhere between the edge 32 of the semiconductor die 12 and the active circuit region 28. In other words, the molding compound crack stop 38 does not need to be over the dicing crack stop 36. Another example is that the molding compound crack stop 38 may not surround the active circuit region 28 like a ring. Instead, the molding compound crack stop 38 can be discontinuous or in any desired shape around the active circuir region 28. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. More-over, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged device, comprising:
   a package substrate;
   a semiconductor die on the package substrate, and
   a molding compound on the package substrate and over the semiconductor die;
   wherein the semiconductor die has:
      a last passivation layer;
      an active circuit region in an internal portion of the semiconductor die;
      an edge seal region along a periphery of the semiconductor die; and
      a structure over the edge seal region extending above the last passivation layer, covered by the molding compound, and comprising a polymer material.

2. The packaged device of claim 1, wherein:
   the polymer material has an interface with the molding compound; and
   the interface comprises direct contact between the molding compound and the polymer material.

3. The packaged device of claim 1, wherein the structure surrounds the active circuit region.

4. The packaged device of claim 1, wherein the semiconductor die further comprises a dicing crack stop region under the structure.

5. The packaged device of claim 4, wherein the semiconductor die further comprises a moisture barrier between the dicing crack stop region and the active circuit region.

6. The packaged device of claim 1, wherein the semiconductor die further comprises an underlying passivation layer under the last passivation layer.

7. The packaged device of claim 1, wherein the molding compound has a lower concentration of filler near a first corner of the semiconductor die than a second corner of the semiconductor die and wherein the structure is along the periphery at the first corner of the semiconductor die.

8. The packaged device of claim 1, further comprising a plurality of wires electrically connecting the package substrate to the semiconductor die, wherein the plurality of wires has a density of at least 20 wires per millimeter at the semiconductor die.

9. The packaged device of claim 1, wherein the structure comprises one of a group consisting of polyimide and benzocyclobutene and is a means for preventing cracks that occur in the molding compound from extending into the active circuit region.

10. The packaged device of claim 1, wherein the structure extends at least five microns above the last passivation layer.

11. A packaged device, comprising:
    a package substrate;
    a semiconductor die on the package substrate; and
    a molding compound on the package substrate and over the semiconductor die;
    wherein the semiconductor die has:
       a last passivation layer;
       an active circuit region in an internal portion of the semiconductor die;
       an edge seal region around a periphery of the semiconductor die; and
       a structure over the edge seal region, covered by the molding compound, and extending above the last passivation layer by at least five microns.

12. The packaged device of claim 11, wherein the structure surrounds the active circuit region.

13. The packaged device of claim 11, wherein the semiconductor die further comprises a dicing crack stop region under the structure.

14. The packaged device of claim 13, wherein the semiconductor die further comprises a moisture barrier between the dicing crack stop region and the active circuit region.

15. The packaged device of claim 11, wherein the structure comprises a polymer material comprising one of a group consisting of polyimide and benzocyclobutene.

16. The packaged device of claim 15, wherein:
    the polymer material has an interface with the molding compound; and
    the interface comprises direct contact between the molding compound and the polymer material.

17. The packaged device of claim 16, wherein the molding compound comprises an epoxy resin and a filler, wherein the filler comprises particles of silicon dioxide.

18. The packaged device of claim 17, wherein the molding compound has a lower concentration of silicon dioxide near a first corner of the semiconductor die than a second corner of the semiconductor die and wherein the structure is along the periphery at the first corner of the semiconductor die.

19. The packaged device of claim 11, further comprising a plurality of wires electrically connecting the package substrate to the semiconductor die, wherein the plurality of wires has a density of at least 20 wires per millimeter at the semiconductor die.

* * * * *